(12) United States Patent
Ventzek et al.

(10) Patent No.: US 10,340,137 B2
(45) Date of Patent: Jul. 2, 2019

(54) MONOLAYER FILM MEDIATED PRECISION FILM DEPOSITION

(71) Applicant: Tokyo Electron Limited, Minato-ku, Tokyo (JP)

(72) Inventors: Peter Ventzek, Austin, TX (US); Alok Ranjan, Tomiya (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/658,133

(22) Filed: Jul. 24, 2017

(65) Prior Publication Data

US 2018/0025908 A1 Jan. 25, 2018

Related U.S. Application Data

(60) Provisional application No. 62/366,516, filed on Jul. 25, 2016.

(51) Int. Cl.
C23C 14/02 (2006.01)
C23C 16/32 (2006.01)
(Continued)

(52) U.S. Cl.
CPC ...... *H01L 21/02299* (2013.01); *C23C 14/024* (2013.01); *C23C 16/325* (2013.01);
(Continued)

(58) Field of Classification Search
None
See application file for complete search history.

(56) References Cited

U.S. PATENT DOCUMENTS 7,202,166 B2 * 4/2007 Wilk .................. C23C 16/0245
257/E21.171
7,799,680 B2 * 9/2010 Wilk .................. C23C 16/0245
257/E21.207
(Continued)

FOREIGN PATENT DOCUMENTS

JP 2000-303174 A 10/2000
JP 2003-73806 A 3/2003
(Continued)

OTHER PUBLICATIONS

Notice of Reason(s) for Rejection dated Jul. 31, 2018 in corresponding Japanese Patent Application No. 2017-142511 (with an English translation) (8 pages).
(Continued)

*Primary Examiner* — David E Graybill
(74) *Attorney, Agent, or Firm* — Rothwell, Figg, Ernst & Manbeck, P.C.

(57) ABSTRACT

A method of forming a thin film is described. The method includes treating at least a portion of a surface exposed on a substrate with an adsorption-promoting agent to alter a functionality of the exposed surface and cause subsequent adsorption of an organic precursor, and thereafter, adsorbing the organic precursor to the functionalized surface to form a carbon-containing film. Then, at least a portion of the surface of the carbon-containing film is exposed to an ion flux to mix the adsorbed carbon-containing film with the material of the underlying substrate and form a mixed film.

12 Claims, 3 Drawing Sheets

(51) Int. Cl.
*H01L 21/02* (2006.01)
*C23C 16/455* (2006.01)
*H01L 21/3105* (2006.01)

(52) U.S. Cl.
CPC .. *C23C 16/45542* (2013.01); *C23C 16/45553* (2013.01); *H01L 21/0228* (2013.01); *H01L 21/02167* (2013.01); *H01L 21/02274* (2013.01); *H01L 21/02315* (2013.01); *H01L 21/02318* (2013.01); *H01L 21/31051* (2013.01)

(56) References Cited

U.S. PATENT DOCUMENTS

| | | | |
|---|---|---|---|
| 10,002,787 B2* | 6/2018 | Yu | H01L 21/76816 |
| 2003/0003635 A1 | 1/2003 | Paranjpe et al. | |
| 2004/0071878 A1 | 4/2004 | Schuhmacher et al. | |
| 2005/0106893 A1* | 5/2005 | Wilk | C23C 16/0245 |
| | | | 438/758 |
| 2007/0111521 A1* | 5/2007 | Wilk | C23C 16/0245 |
| | | | 438/680 |
| 2009/0035947 A1 | 2/2009 | Horii et al. | |
| 2018/0025908 A1* | 1/2018 | Ventzek | C23C 14/024 |
| | | | 438/760 |
| 2018/0144977 A1* | 5/2018 | Yu | H01L 21/76816 |

FOREIGN PATENT DOCUMENTS

| | | |
|---|---|---|
| JP | 2004-165634 A | 6/2004 |
| JP | 2007-516599 A | 6/2007 |
| JP | 2010-28124 A | 2/2010 |
| KR | 10-2008-0012379 A | 2/2008 |
| WO | 2006/134930 A1 | 12/2006 |

OTHER PUBLICATIONS

Office Action dated Sep. 5, 2018 in corresponding Korean Patent Application No. 10-2017-0094367 (with an English translation) (14 pages).

* cited by examiner

MONOLAYER FILM MEDIATED PRECISION FILM DEPOSITION

CROSS-REFERENCE TO RELATED APPLICATIONS

This application is related to and claims priority to U.S. Provisional Patent Application Ser. No. 62/366,516 filed on Jul. 25, 2016, the entire contents of which are herein incorporated by reference.

FIELD OF INVENTION

The invention relates to a method for forming a thin film, and more particularly, a precision deposition technique for forming a thin film for electronic device applications.

BACKGROUND OF THE INVENTION

The present invention relates to a method of manufacturing a semiconductor device such as an integrated circuit and transistors and transistor components for an integrated circuit. In the manufacture of a semiconductor device (especially on the microscopic scale), various fabrication processes are executed such as film-forming depositions, etch mask creation, patterning, material etching and removal, and doping treatments, are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other. As lateral dimensions densify and structures develop vertically, the need for precision material deposition and etch becomes more compelling.

SUMMARY

Techniques herein pertain to device fabrication using precision deposition techniques.

A method of forming a thin film is described. The method includes treating at least a portion of a surface exposed on a substrate with an adsorption-promoting agent to alter a functionality of the exposed surface and cause subsequent adsorption of an organic precursor, and thereafter, adsorbing the organic precursor to the functionalized surface to form a carbon-containing film. Then, at least a portion of the surface of the carbon-containing film is exposed to an ion flux to mix the adsorbed carbon-containing film with the material of the underlying substrate and form a mixed film.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION

Techniques herein pertain to device fabrication using precision deposition techniques. One such material requiring precision deposition for current and future device technology is SiC. SiC films have many applications in semiconductor device manufacturing ranging from power electronics to barrier film applications. To that extent there is a host of CVD (chemical vapor deposition) and emerging ALD (atomic layer deposition) techniques for their deposition. CVD methods, generally at high temperature, typically employ precursors, such as dichlorosilane (DCS) as a silicon precursor and a hydrocarbon ($CH_4$, $C_2H_2$, etc.) as a carbon precursor.

ALD, on the other hand, is challenging, wherein a surface pre-treatment or self-limiting surface reaction with the silicon surface is necessary to deposit an organic material. Organic structures are not typically deposited in a self-limiting manner over silicon without the introduction of an exotic functional group.

One example includes reacting DCS with TMA (trimethyl aluminum). The aluminum preferentially bonds with Cl from the SiCl groups deposited using DCS thus leaving the organic groups to bond to Si. $AlCl_3$ is volatile to relatively low temperatures but not below 400 C. The choice of metalorganic precursors is limited, however, for films that need to be deposited post gate formation due to thermal budget restrictions. There is a need for facile deposition of SiC materials, preferably in a non-conformal manner (vertical growth) at low temperature.

Figure 1:
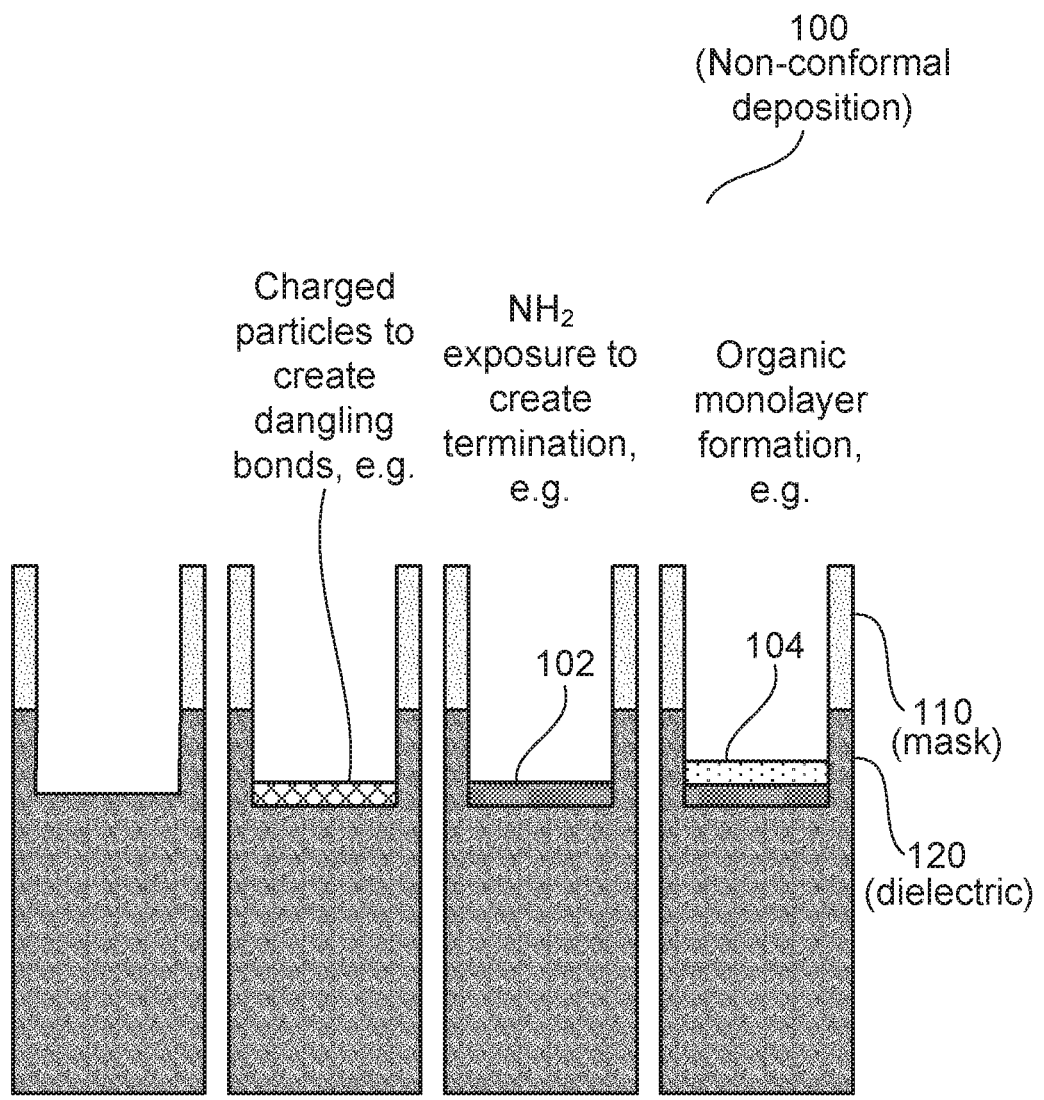
FIG. 1 illustrates a method of forming a thin film on a substrate according to an embodiment.
Figure 2:
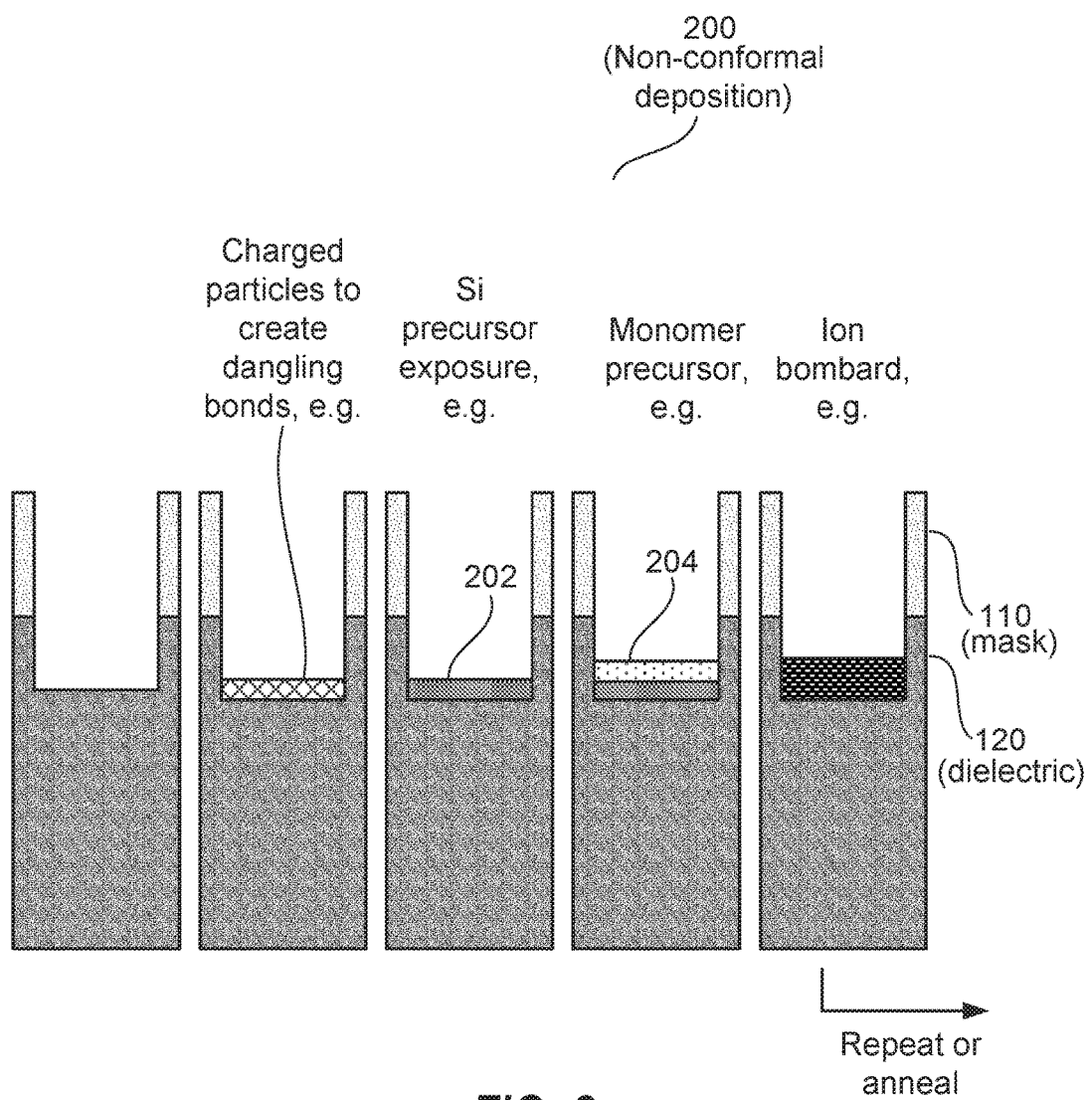
FIG. 2 illustrates a method of forming a thin film on a substrate according to an embodiment.

In one embodiment, a self-limiting organic (—CH) film, preferably a monolayer film, is placed on at least a portion of a substrate during an adsorption step. Thereafter, the adsorbed film is exposed to an ion flux, such as an ion bombardment from an inert gas plasma, to cause mixing of the adsorbed film with the underlying substrate material, which can include silicon (Si). When the adsorbed film includes carbon (C) and the underlying material includes Si, a thin layer of SiC can be formed. In an example, to deposit or adsorb an organic film, the surface of the substrate, e.g., silicon surface, is functionalized with $NH_2$. In this example, the resultant film is SiCN, and ion bombardment denudes the layer of H. FIGS. 1 and 2 illustrate a non-conformal organic-ALD (atomic layer deposition) 100 including the promotion of adsorbing an organic film 104 onto a substrate having mask layer 110 and dielectric layer 120 by pre-treating the substrate with an adsorption-promoting agent 102. This agent alters the surface functionality to affect adhesion of the applied organic film. As an example, a silicon surface is functionalized with $NH_2$, and a mixed layer is formed through the subsequent adsorption of an organic layer and Si/C mixing via ion bombardment.

Figure 3:
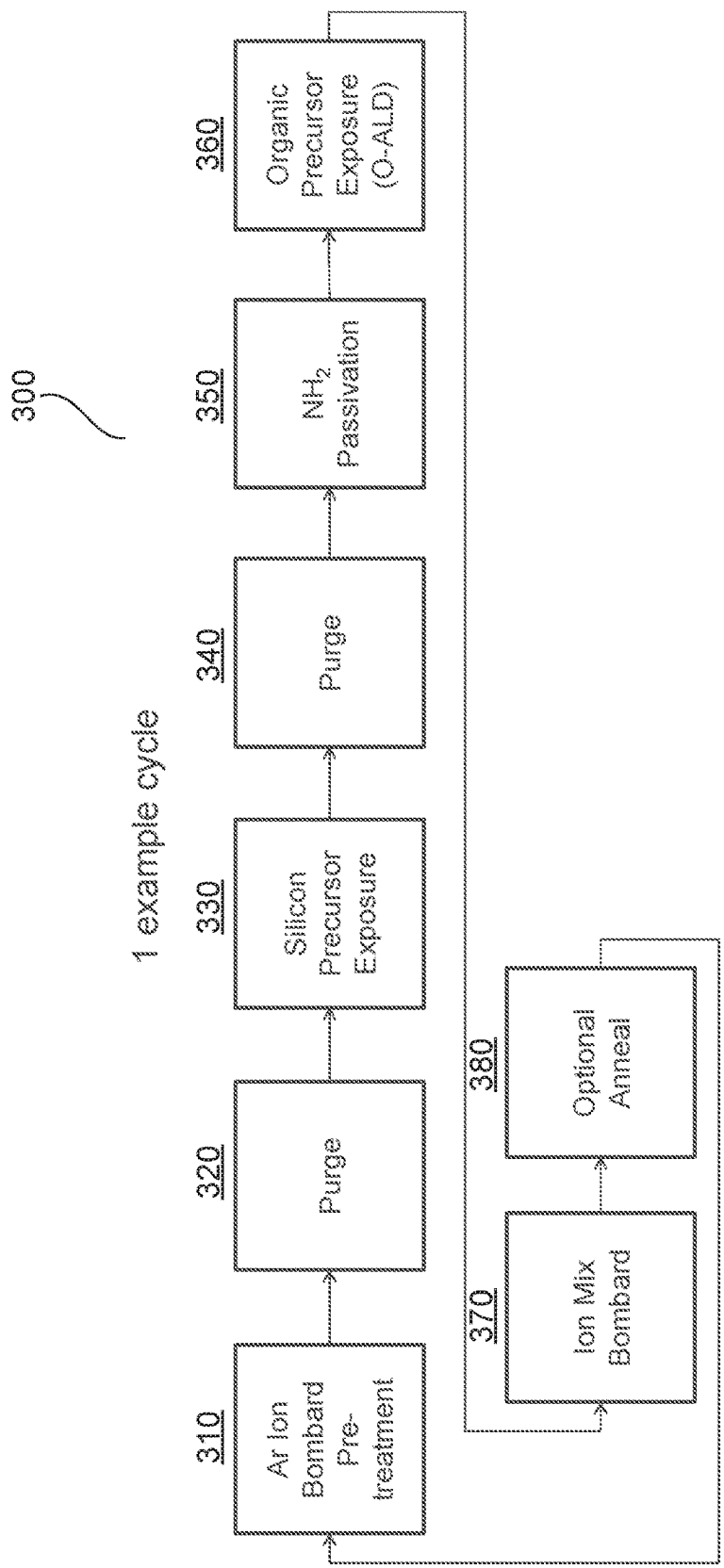
FIG. 3 provides a flow chart illustrating a method of forming a thin film according to an embodiment.

To deposit multiple layers, a non-conformal organic-ALD (atomic layer deposition) 200 including each of the aforementioned steps is supplemented by a silicon deposition step (see FIGS. 2 and 3) to form silicon layer 202, followed by monomer layer 204. FIG. 3 provides a flow chart 300 including exemplary steps for forming a thin film according to various embodiments. The exemplary steps can include (1) an ion bombardment with a noble gas element (e.g., Ar) for pre-treatment (310), (2) a purge (320), (3) a silicon precursor exposure (330), (4) a purge (340), (5) an NH2 passivation (350), (6) an organic precursor exposure (360), (7) an ion bombardment to mix layers (370), and (8) an optional anneal (380). The silicon deposition step may or may not be self-limiting. If silane is used as the silicon depositing precursor, then the deposition step must be timed. If Cl can be tolerated, then DCS can be used and the deposition is essentially self-limiting and timing is not necessary.

The process is repeated and comprises alternating —CH and —Si film depositions mixed by ion bombardment at energies below the sputter threshold. Vertical growth is favored as reactive surfaces are horizontal owing to the ions directionality in the sheath.

If SiC(N) films with good electrical characteristics are desired, then the films may require annealing. However, for most applications, a disordered film with reasonable stoichiometry is sufficient with de facto densification brought about by the ion bombardment itself.

Densification by ion bombardment is one exemplary means by which the film nature and properties can be controlled. With sufficient mixing due to flux and ion energy, Si—C can be formed. With less ion bombardment and less energy, regions of carbon rich polymer and silicon rich regions can co-exist. Annealing this material will result in the vaporization of the polymeric material leaving behind micro pores. Oxidation or nitridation of the bulk material mediated by inter pore transport will result in the modification of the k value of the material.

A preferred method includes exposing the surface to an ammonia plasma so that the surface is occupied by reactive —$NH_2$ bonds. Rendering the surface functionalizable by —$NH_2$ may require pretreatment by a halogen material. However, ion bombardment from an inert gas plasma alone is often sufficient to create the dangling bonds to receive $NH_2$ radicals. The $NH_2$ groups on the surface are then reactive with organic material or polymer precursors. This exposure step can be plasma free.

Material mixing is then performed during ion bombardment with low and controlled energy ions. The formation of ion flux may be achieved in a 13.56 MHz capacitively coupled plasma (e.g., power ranging from 5-25 W) at a chamber pressure of 100-500 mTorr, or a spatially segregated plasma at high pressure, such as a surface wave driven microwave source (e.g., power ranging from 1000-2000 W) with equivalently low bias power.

The treating, adsorbing, and exposing steps may be repeated to remove a pre-determined amount of material from the substrate. These steps, and others, may be performed in the same process chamber, or separate chambers. Each process step can include gas-phase chemistry, and be performed at vacuum pressures.

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of forming a thin film, comprising:
forming a functionalized surface by treating at least a portion of an exposed surface on a substrate with an adsorption-promoting agent to alter a functionality of the exposed surface and cause subsequent adsorption of an organic precursor;
thereafter, adsorbing the organic precursor to the functionalized surface to form a carbon-containing film; and
forming a mixed film by exposing at least a portion of a surface of the carbon-containing film to an ion flux to mix the carbon-containing film with a material of the substrate, wherein the material of the substrate is located underneath the carbon-containing film.

2. The method of claim 1, wherein the material of the substrate comprises silicon, germanium, or a silicon-germanium alloy.

3. The method of claim 1, wherein the adsorption-promoting agent is $NH_2$ formed using an ammonia plasma.

4. The method of claim 1, further comprising:
pre-treating the exposed surface of the substrate with a pre-treatment charged particle flux prior to treating the exposed surface with the adsorption-promoting agent.

5. The method of claim 4, wherein the pre-treatment charged particle flux includes an ion flux from an inert gas plasma.

6. The method of claim 1, wherein the organic precursor includes a —CH containing precursor.

7. The method of claim 1, wherein the mixed film includes an Si—C containing film.

8. The method of claim 1, further comprising:
adsorbing a Si-containing precursor onto the exposed surface of the substrate prior to treating the substrate with the adsorption-promoting agent.

9. The method of claim 1, further comprising:
annealing the mixed film.

10. The method of claim 1, further comprising:
adsorbing a Si-containing precursor onto the exposed surface of the substrate following the formation of the mixed film.

11. The method of claim 10, further comprising:
repeating the step of forming the functionalized surface, the step of adsorbing the organic precursor, and the step of forming the mixed film to create a multi-layer mixed film.

12. The method of claim 3, further comprising:
purging the ammonia plasma following the step of forming the functionalized surface and preceding the step of adsorbing the organic precursor.

* * * * *